United States Patent [19]
Shipley et al.

[11] Patent Number: 5,966,766
[45] Date of Patent: Oct. 19, 1999

[54] APPARATUS AND METHOD FOR CLEANING SEMICONDUCTOR WAFER

[75] Inventors: Kevin D. Shipley; Peter A. Burke, both of Austin, Tex.

[73] Assignee: Advanced Micro Devices, Inc., Sunnyvale, Calif.

[21] Appl. No.: 08/944,248

[22] Filed: Oct. 6, 1997

[51] Int. Cl.⁶ .................................................. B08B 11/00
[52] U.S. Cl. ................................ 15/102; 15/50.1; 15/98; 15/230
[58] Field of Search .................... 15/49.1, 50.1, 15/97.1, 98, 102, 230, 230.1, 230.16, 230.19, 180, 28; 451/514, 515

[56] References Cited

U.S. PATENT DOCUMENTS

| | | | |
|---|---|---|---|
| 1,929,345 | 10/1933 | Brwon et al. ................................. | 15/98 |
| 3,034,625 | 5/1962 | Grote ...................................... | 451/514 |
| 4,322,920 | 4/1982 | Wells ........................................ | 15/180 |
| 4,523,411 | 6/1985 | Freerks ..................................... | 15/97.1 |
| 4,811,443 | 3/1989 | Nishizawa ................................ | 15/102 |
| 5,146,643 | 9/1992 | Bojar et al. ............................... | 15/180 |
| 5,185,964 | 2/1993 | Englund et al. .......................... | 15/230 |
| 5,320,706 | 6/1994 | Blackwell . | |
| 5,361,449 | 11/1994 | Akimoto . | |
| 5,495,632 | 3/1996 | Baker ......................................... | 15/28 |
| 5,498,199 | 3/1996 | Karlsrud et al. . | |
| 5,597,443 | 1/1997 | Hempel . | |
| 5,616,069 | 4/1997 | Walker et al. . | |
| 5,778,481 | 7/1998 | Amsden et al. ........................... | 15/102 |
| 5,870,793 | 2/1999 | Choffat ..................................... | 15/102 |

FOREIGN PATENT DOCUMENTS

| | | | |
|---|---|---|---|
| 416055 | 9/1934 | United Kingdom ....................... | 15/98 |

OTHER PUBLICATIONS

Bostik Product Data, "7119M: Liquid Adhesives," published Oct. 1994, 2 sheets.

Patent Abstracts of Japan 08318226, published Dec. 3, 1996 (with attached Japanese language patent),4 sheets.

Patent Abstracts of Japan 08241880, published Sep. 17,1996, (with attached Japanese language patent),5 sheets.

*Primary Examiner*—Terrence R. Till
*Attorney, Agent, or Firm*—Conley, Rose & Tayon; Robert C. Kowert; Kevin L. Daffer

[57] ABSTRACT

A method and apparatus for cleaning a semiconductor wafer. The apparatus preferably includes a brush holder that may include a base and a connection stud extending from the base. The base preferably includes a first plurality of openings and a receiving lip for receiving a brush that is disposed on its lower surface. The openings preferably serve to pass a cleaning solution to the brush during cleaning of a semiconductor wafer. The brush preferably includes a substantially flexible material and a plurality of protrusions for contacting a semiconductor wafer. A backing plate preferably is attached to one side of the brush for connecting the brush to the brush holder. The backing plate preferably includes a plurality of openings arranged to match the first plurality of openings on the base of the brush holder. The backing plate preferably further includes an outer edge capable of forming a snap-fit engagement within the receiving lip of the brush holder to: (a) facilitate periodic replacement of the brush and (b) form a mechanical connection between the brush and brush holder that can withstand the presence of relatively basic or acidic cleaning agents.

14 Claims, 6 Drawing Sheets

APPARATUS AND METHOD FOR CLEANING SEMICONDUCTOR WAFER

BACKGROUND OF THE INVENTION

1. Field of the Invention

The present invention generally relates to method and apparatus for cleaning a semiconductor wafer, and more particularly, an embodiment of the invention relates to a brush assembly for removing slurry particles from a semiconductor wafer.

2. Description of the Related Art

Integrated circuit fabrication typically includes a process step of creating an extremely flat surface on a surface of a semiconductor wafer. Chemical-Mechanical Polishing (CMP) is a known technique for planarizing the surface of a semiconductor wafer to a desired thickness. CMP typically involves contacting a polishing pad against the wafer and rotating the polishing pad with respect to the wafer. A slurry containing abrasive particles is typically applied to the surface of the wafer to facilitate mechanical polishing of the wafer. The slurry may also contain a chemical agent to increase the rate that material is removed from the wafer. After the wafer is treated in a CMP process, it may be scrubbed to clean the wafer surface of any remaining slurry particles. The wafer may be contacted with water to remove the slurry particles.

In one process, a brush assembly that includes a brush attached to a brush holder is used to clean a semiconductor wafer after a CMP process. The brush includes a backing plate comprising a plurality of holes disposed about the edges of the backing plate. The brush includes a surface for contacting the wafer located on a side opposite the backing plate. Water is passed through the openings in the backing plate to the portion of the brush that contacts the wafer surface during cleaning. The brush is connected to the brush holder via a double-sided adhesive coupon placed between the backing plate and the brush holder.

The brushes used in the above-described system need to be periodically replaced. Such replacement tends to be difficult and time-consuming. The old brush and the adhesive coupon must first be removed from the brush holder. Removal of adhesive residue left by the adhesive coupon tends to be difficult, and acetone or another chemical often must be applied to the brush holder to facilitate removal of the adhesive residue. Once the old brush and adhesive coupon are removed, a new double-sided adhesive coupon is placed on the brush holder. Backing paper usually must be peeled from both sides of the adhesive coupon to expose its adhesive surfaces. Occasionally, the adhesive coupon tears when the backing paper is peeled away. The adhesive coupon contains a number of openings arranged to match a pattern of openings on the brush holder and the backing plate of the brush, It tends to be difficult to position the adhesive coupon on the backing plate and/or the brush holder such that the openings in the backing plate, brush holder, and adhesive coupon are properly aligned. In addition, the adhesive coupon may be incompatible with cleaning agents (e.g., ammonium hydroxide) that reduce or eliminate the adhesive capability of the adhesive coupon.

The brushes are typically replaced by operators who must wear latex gloves, which increases the difficulty and time required to: (a) remove the backing paper from the adhesive coupon without tearing the coupon, and (b) properly position the adhesive coupon on both the backing plate and the brush holder such that the patterns of openings are aligned in each of the three components. An operator typically spends about 2–4 hours to replace 6 of the brushes.

It is therefore desirable that an improved brush assembly be derived for cleaning a semiconductor wafer.

SUMMARY OF THE INVENTION

In accordance with the present invention, a brush assembly is provided that largely eliminates or reduces the aforementioned disadvantages of certain conventional semiconductor wafer cleaning brushes. An embodiment of the invention relates to a brush assembly for cleaning a semiconductor wafer that includes a brush holder, a brush, and a backing plate.

The brush holder preferably includes a base and a connection stud extending from the base. The connection stud preferably includes a slot for attaching the brush holder to a scrubber of a polishing device. The connection stud may be connected to a hollow shaft that is adapted to deliver cleaning fluid to the brush. The connection stud may include one or more openings for distributing cleaning fluid from the polishing device to the upper surface of the base. The base preferably includes a receiving lip on its lower surface for forming a fixable engagement with a brush. The base preferably further includes a plurality of openings for passing cleaning solution from the brush holder to the surface of the brush.

The brush is preferably substantially circular in shape and preferably includes a substantially flexible material for contacting the semiconductor wafer. A plurality of protrusions may be formed in the substantially flexible material. The protrusions may be substantially compressible. The brush may contain a central opening in the flexible material for facilitating the dispersal of cleaning fluid directly onto the semiconductor wafer.

A backing plate is preferably attached to one side of the brush and may serve to connect the brush to the brush holder. The backing plate preferably includes a plurality of openings arranged to match the pattern of openings on the base of the brush holder. The backing plate preferably includes an outer edge that is shaped and sized to form a snap-fit engagement within the receiving lip of the brush holder when the brush and brush holder are pressed together. The backing plate may include an alignment portion extending from its edge that is sized to fit within an aperture formed in the receiving lip of the brush holder. Placing the alignment portion within the aperture preferably causes the openings on the brush holder and the openings on the backing plate to be properly aligned. When the brush is secured within the brush holder, force may be applied to the alignment portion to remove the brush from the brush holder. The backing plate may include an opening that communicates with an axial borehole of the connection stud, the brush may include a central opening in its flexible material that communicates with the axial borehole of the connection stud through the opening in the backing plate. The backing plate may include a raised lip on its upper surface for containing a predetermined volume of cleaning fluid on the upper surface of the base.

An advantage of the invention relates to a brush assembly for cleaning a semiconductor wafer that includes components that are able to be quickly and easily assembled by an operator onsite.

Another advantage of the invention relates to a brush assembly configured to distribute cleaning fluid onto the surface of a brush in a manner to increase the rate of particle removal on a semiconductor wafer.

Yet another advantage of the invention relates to a brush assembly configured to inhibit particles from being transferred from a brush to a semiconductor wafer when the brush is removed from the semiconductor wafer.

Still another advantage of the invention relates to a brush assembly for cleaning a semiconductor wafer that includes a brush and brush holder in a mechanical engagement that can withstand the presence of relatively acidic or basic cleaning agents.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
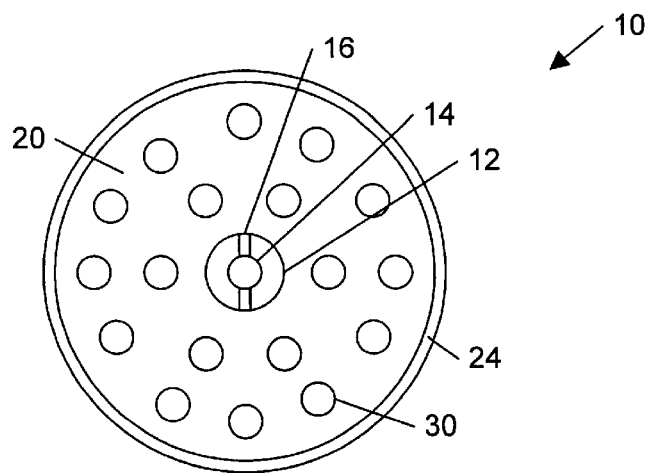
FIG. 1 depicts a top view of an embodiment of a brush holder.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The present invention relates to a brush assembly for cleaning a semiconductor wafer. The brush assembly may be used to clean a semiconductor wafer after the wafer has been planarized in a Chemical-Mechanical Polishing (CMP) process. More particularly, the brush assembly may be used to scrub away slurry particles that remain on the surface of a semiconductor wafer after the wafer has been treated in a CMP process.

A brush holder 10 for cleaning a semiconductor wafer is depicted in FIG. 1. The brush holder is preferably adapted to receive a brush for scrubbing one or more semiconductor wafers. The brush holder is preferably made of plastic. In one embodiment, the brush holder is made of natural Delrin. The brush holder preferably includes a connection stud 12 for attaching the brush holder to a polishing machine scrubber. The connection stud 12 preferably has a substantially cylindrical shape, although it may have other shapes such as that of a rectangular or triangular prism. The connection stud preferably includes an axial borehole 14 for accepting a rotatable shaft 33 (shown in FIG. 5) and for passing a cleaning fluid from the scrubber to a brush. The connection stud may include a substantially U-shaped slot 16 for providing a fixable connection with the polishing machine.

Slot 16 may have a substantially circularly shaped end 19 for receiving a connecting pin.

The brush holder is preferably has substantially circularly shaped edge and is preferably rotatable by the scrubber. One polishing apparatus that may be used in conjunction with the brush assembly of the present invention is the Speedfam model CMP-5, commercially available from Speedfam Corporation of Des Plaines, Ill. The brush assembly may also be used with an Auriga polisher. U.S. Pat. No. 5,498,199 relates to an apparatus for polishing semiconductor wafers and is incorporated by reference as if fully set forth herein.

Figure 2:
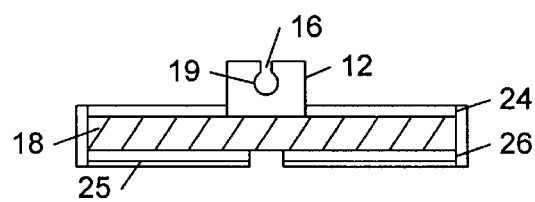
FIG. 2 depicts a cross sectional side view of the brush holder of FIG. 1.
Figure 3:
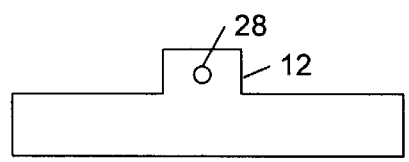
FIG. 3 depicts a side view of the brush holder of FIG. 1.

Side views of an embodiment of the brush holder are illustrated in FIG. 2 and FIG. 3. The connection stud preferably extends from base 18, which includes an upper surface 20 and a lower surface 22. The base may serve as a "dam" to temporarily hold cleaning fluid that is passed to the brush. The upper surface of the base preferably has a raised ridge 24 about its outer edge to contain cleaning fluid within the outer edge. The connection stud may further include one or more openings 28 disposed on its outer surface that communicate with borehole 14. Opening(s) 28 may serve to distribute cleaning fluid about the upper surface of the base. The base preferably includes a plurality of openings 30 that extend between the upper and lower surfaces of the base. The openings 30 may serve to pass cleaning fluid to the brush during polishing. The openings 30 may be disposed in one or more rows about the circumference of the base and are preferably sized to allow passage of a predetermined amount of cleaning fluid to the brush during polishing.

Figure 4:
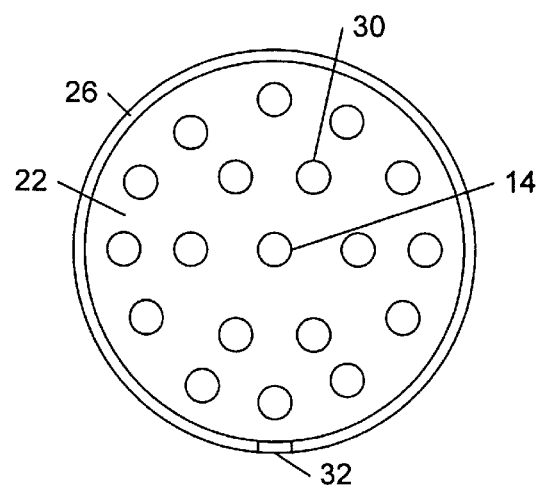
FIG. 4 depicts a bottom view of the brush holder of FIG. 1.

A bottom view of an embodiment of the brush holder is illustrated in FIG. 4. The bottom surface of the brush holder preferably includes a raised receiving lip 26 disposed thereon. The receiving lip is preferably adapted to form a fixable engagement with the brush. An aperture 32 may be formed in the receiving lip to facilitate orientation of the brush during assembly of the brush and brush holder.

Figure 5:
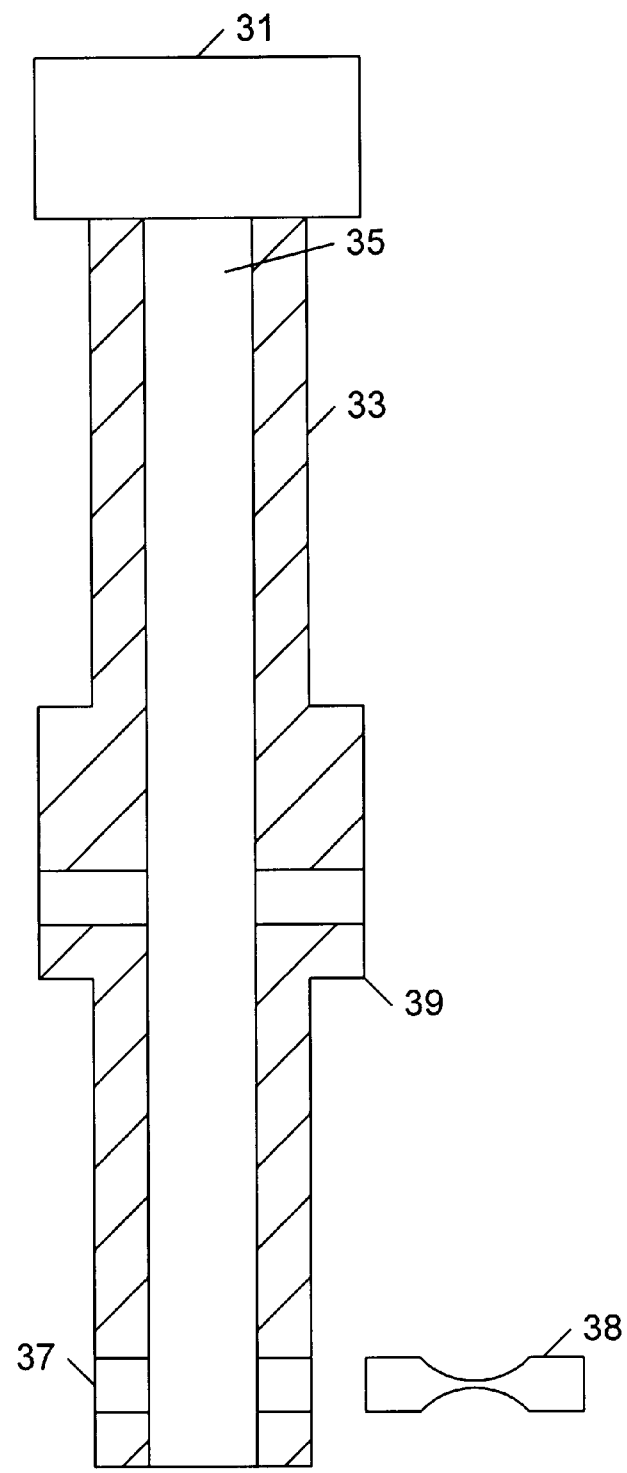
FIG. 5 depicts a cross sectional view of an embodiment of a scrubber shaft.

FIG. 5 illustrates an embodiment of a shaft 33 for connecting the brush holder to a scrubber 31. The shaft 33 is preferably hollow such that a conduit 35 is formed therein. The shaft is preferably rotatable and capable of delivering cleaning fluid to the brush through conduit 35. The shaft may be connected to scrubber 31 via a rotable union at the upper end of the shaft. The shaft may include a borehole 37 for receiving connecting pin 38. The connecting pin is preferably sized to be received within end 19 such that a snap-fit engagement can be formed between shaft 33 and the brush holder. After the connecting pin is inserted within borehole 37, the shaft is preferably inserted into borehole 14 and connecting pin 38 is preferably pressed into slot 16 until it comes to rest within end 19. The width of the U-shaped slot proximate its upper end is preferably slightly less than the diameter of connecting pin 38 to allow the connecting pin to be snapped into a fixable engagement within end 19. The connecting pin preferably includes a middle section having a reduced diameter to facilitate the passage of fluid through conduit 35 proximate connecting pin 38. The shaft preferably includes a section 39 having an enlarged diameter that serves as a mechanical stop. The lower portion of section 39 may contact a bearing (not shown).

Figure 6:
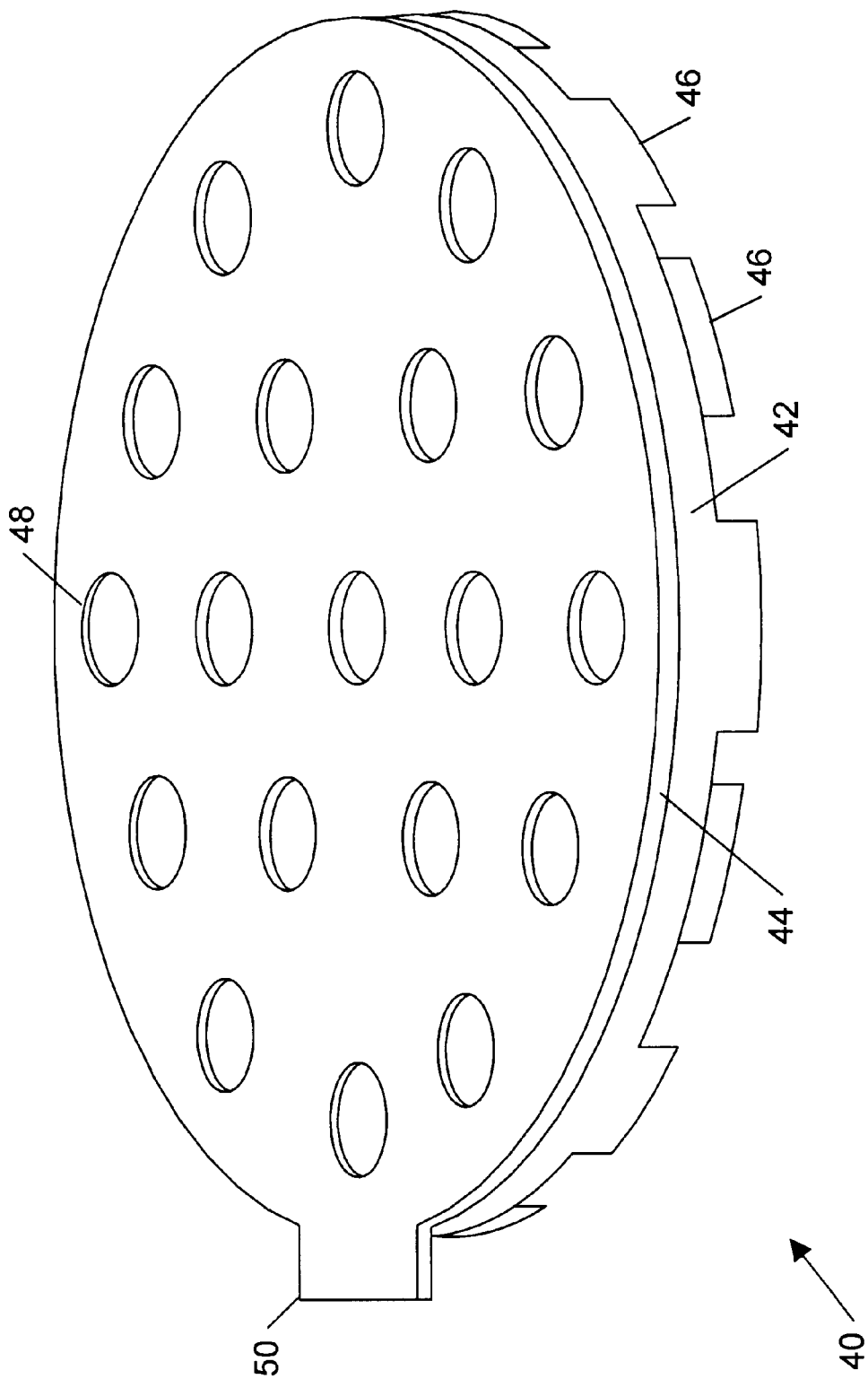
FIG. 6 depicts a top perspective view of an embodiment of a brush including a backing plate.

FIG. 6 illustrates a top perspective view of a brush 40 for scrubbing semiconductor wafers. The brush preferably includes a substantially flexible material 42 for contacting the semiconductor wafer. The substantially flexible material may be any suitable material for polishing a semiconductor wafer including, for example, foam and/or plastic. In one embodiment, the substantially flexible material is polyvinyl acetal foam. The brush preferably is attached to a backing plate 44 that may serve to connect the brush with brush holder 10. The brush may be glued to backing plate 44 with, for example, an epoxy that maintains its adhesive capability in the presence of water and/or cleaning fluids having relatively basic or acidic pH values. The flexible material preferably includes a plurality of protrusions 46 for engaging the semiconductor wafer. The protrusions may be substantially compressible such that the height of the protrusions changes when the brush is pressed against a semiconductor wafer. The protrusions are preferably arranged on the brush in a pattern that matches the pattern of openings 30 disposed on the brush holder. Backing plate 44 preferably contains a plurality of openings 48 arranged in a pattern that matches the pattern of openings 30 on brush holder 10 and the pattern of protrusions 46 on brush 42. In this manner, cleaning fluid may be passed from the upper surface 20 through openings 30 and 48 to permeate the brush at locations proximate the protrusions.

Figure 7:
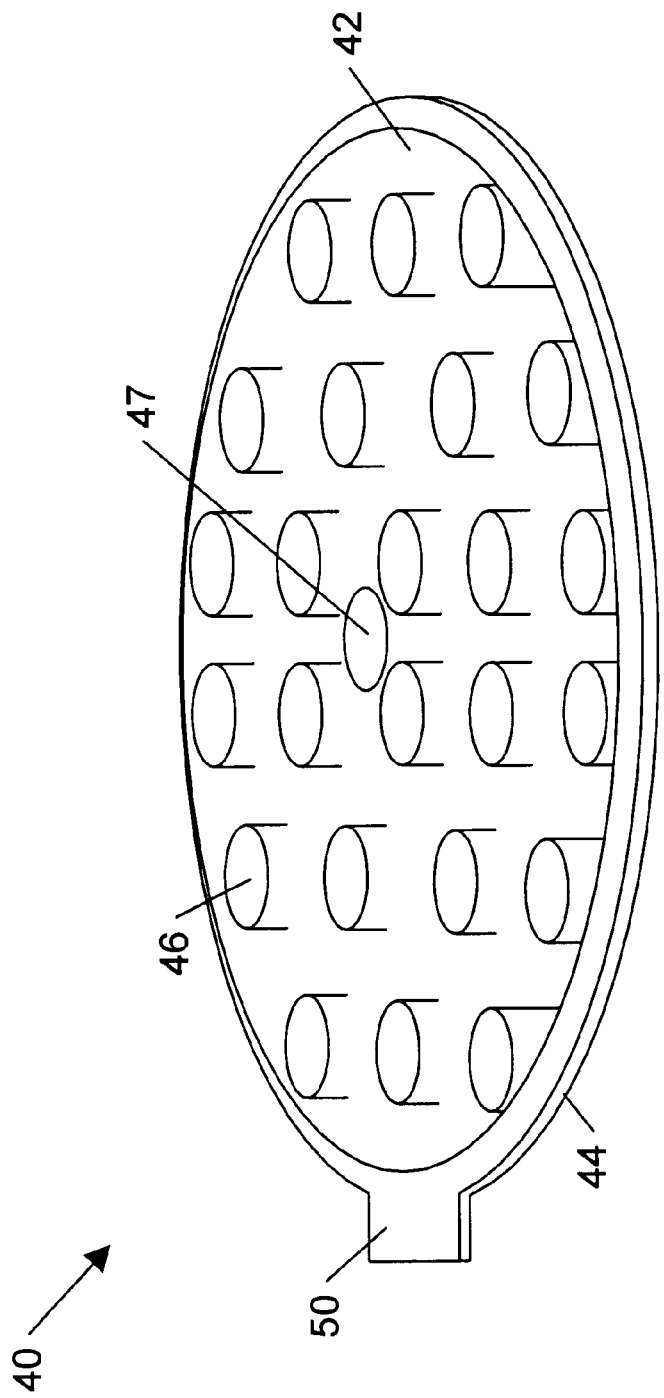
FIG. 7 depicts a bottom perspective view of the brush of FIG. 6.

FIG. 7 illustrates a bottom perspective view of brush 40. In an embodiment, the brush may include a central opening 47 that extends through flexible material 42. Central opening 47 preferably communicates with axial borehole 14. In this manner, cleaning fluid may be passed directly from the brush to a semiconductor wafer without first having to diffuse through the flexible material 42 of the brush. In one embodiment, a spray of cleaning fluid may be directed through central opening 47 to a semiconductor wafer when the brush is removed from the semiconductor wafer. The spray of cleaning fluid preferably imparts a pressure of between about 20 psig and about 30 psig, and more preferably about 25 psig against the semiconductor wafer. It is believed that surface tension between the brush and the semiconductor wafer tends to cause particles to be transferred from the brush to the semiconductor wafer when the brush is removed from the semiconductor wafer in conventional processes. The spray of cleaning fluid directly against the wafer surface preferably reduces the surface tension to inhibit the transfer of particles from the brush to the wafer during removal of the brush from the wafer.

Figure 8:
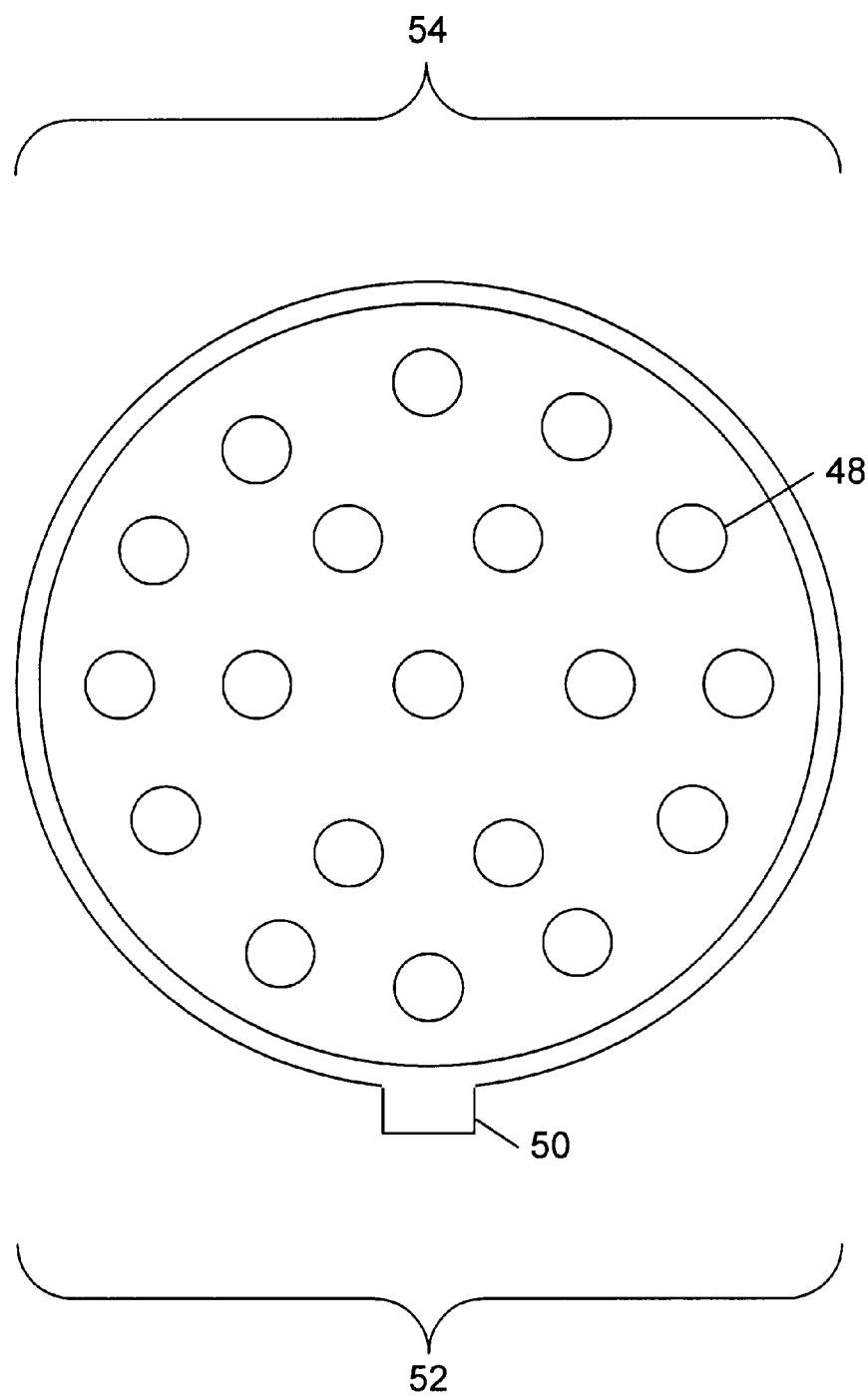
FIG. 8 depicts a bottom view of an embodiment of a brush including a backing plate.

FIG. 8 illustrates a top view of an embodiment of backing plate 44 for connecting the brush 42 to the brush holder 10. The backing plate is preferably made of plastic. In an embodiment, the backing plate is made of polyvinyl chloride. The backing plate is preferably shaped to fit within receiving lip 26 and is preferably sized to permit a "snap-fit engagement" between the brush and the brush holder. As described herein, "snap-fit engagement" is taken to mean a fixable mechanical engagement that is achievable by pressing together two or more components. The snap-fit engagement may be achieved by dimensioning the outer edges of the backing plate such that the backing plate has a slightly larger width or diameter than that of receiving lip 26 such that an interference fit can be formed. In an embodiment, the receiving lip is tapered such that the cross sectional area of the cavity formed on lower surface 22 increases in a direction toward lower surface 22. In this manner, the backing plate could be pressed against the brush holder with sufficient force to overcome the friction between the top of the receiving lip and the backing plate, thereby causing the backing plate to rest deeper within the cavity where the cavity formed by the receiving lip has a slightly greater diameter.

In an alternate embodiment, the top portion of the receiving lip 26 contains an inwardly-disposed lip portion 25 (shown in FIG. 2) for maintaining the brush within the brush holder. The inwardly-disposed lip portion 25 extends in a radially inward direction toward borehole 14. In an embodiment, the inwardly-disposed lip portion 25 is dimensioned such that it is barely observable by the human eye. The brush is preferably pressed into engagement with the brush holder such that the outer edge of the backing plate fits between the inwardly-disposed lip portion 25 and the bottom surface 22.

The backing plate preferably comprises an alignment portion 50 that extends from its outer edge. Alignment portion 50 is preferably sized to fit within aperture 32 of the brush holder. Alignment portion 50 is preferably disposed on the backing plate at a predetermined location such that placing alignment portion 50 within aperture 32 causes the openings 30 in the brush holder and the openings 48 in the backing plate to be properly aligned. To insert the backing plate within the cavity formed by receiving lip 26, alignment portion 50 is preferably first placed within aperture 32. The backing plate may be partially disposed within receiving lip 26 by positioning the backing plate at an angle such that a first edge portion 52 of the backing plate proximate alignment portion 50 is inserted within receiving lip 26, while a second edge portion 54 opposite the first edge portion remains outside of the cavity formed by the receiving lip. Once the first edge portion is positioned within receiving lip 26 at a location that is preferably between inwardly-disposed lip portion 25 and bottom surface 22, the second edge portion may be snapped into the receiving lip to form a snap-fit engagement between the brush and the brush holder. To remove the backing plate from the brush holder, pressure may be applied to alignment portion 50 in a direction away from bottom surface 22. In this manner, first edge portion 52 may be removed from receiving lip 26, and then second edge portion 54 may be removed from the receiving lip to separate the brush and brush holder.

Figure 9:
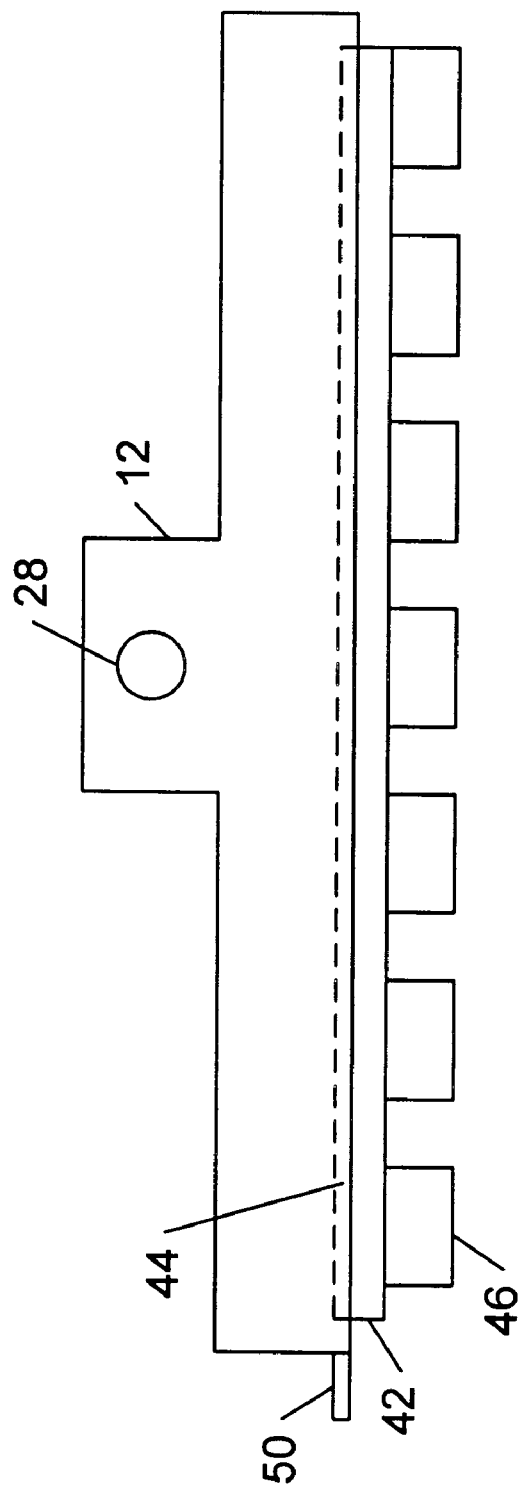
FIG. 9 depicts a side view of an embodiment of a brush assembly including a brush disposed within a brush holder.

A side view of an assembled brush and brush holder is depicted in FIG. 9. The brush assembly of the present invention preferably allows that brush 40 be replaced in a time of less than about 2 minutes, and more preferably about 1 minute or less. The backing plate and the brush holder may form a mechanical snap-fit engagement together to allow the brush to be used in conjunction with cleaning agents (e.g., ammonium hydroxide) that tend to damage the adhesive coupons used in some conventional brush assemblies.

During operation, brush 40 is preferably pressed against the semiconductor wafer at a pressure between about 30 psig and about 60 psig. The brush is preferably rotated by a scrubber at greater than 200 rpm. The brush is preferably applied to the semiconductor wafer for less than about 15 seconds. In one embodiment, the brush contacts the semiconductor wafer for about 8 seconds. The cleaning fluid distributed from the brush holder to the surface of the brush may be water, an aqueous solution such as ammonium hydroxide, or other cleaning agents suitable for contacting a semiconductor wafer. Ammonium hydroxide is generally preferred as a cleaning agent since it may act as a surfactant to facilitate removal of slurry particles from the surface of a semiconductor wafer. Ammonium hydroxide may also electrically stabilize charged particles on the surface of the wafer to allow such particles to be removed more easily. Moreover, the presence of ammonium hydroxide on brush 40 may clean the brush, thereby reducing the frequency with which the brush must be replaced. The brush preferably cleans the wafer so that it contains less than 100 particles having a diameter of 0.2 microns or greater.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An apparatus for cleaning a semiconductor wafer, comprising
    a brush holder comprising a base and a connection stud extending from the base, the base comprising a lower surface having a receiving lip disposed thereon;
    a brush comprising a substantially flexible material for contacting the semiconductor wafer; and
    a backing plate for connecting the brush to the brush holder, the backing plate being attached to the brush and comprising an outer edge capable of forming a snap-fit engagement within the receiving lip of the brush holder during use.

2. The apparatus of claim 1 wherein the base comprises a first plurality of openings extending between an upper surface of the base and the lower surface, and wherein the backing plate comprises a second plurality of openings arranged in a pattern to match the first plurality of openings.

3. The apparatus of claim 2 wherein the receiving lip comprises an aperture, and wherein the backing plate further comprises an alignment section extending therefrom, the alignment section being sized to fit within the aperture to align the first plurality of openings with the second plurality of openings.

4. The apparatus of claim 1 wherein the receiving lip comprises an aperture, and wherein the backing plate further comprises an alignment section extending therefrom, the alignment section being sized to fit within the aperture and being adapted to receive a force to facilitate separation of the backing plate and the brush holder during use.

5. The apparatus of claim 1 wherein the connection stud comprises an upper portion and a lower portion, the upper portion comprising a slot for connecting the brush holder to a scrubber, the lower portion being connected to the base and comprising an opening for distributing fluid from the connection stud.

6. The apparatus of claim 1 wherein the backing plate comprises an opening communicating with an axial borehole disposed within the connection stud.

7. The apparatus of claim 1 wherein the base further comprises an upper surface having a raised lip disposed thereon for containing fluid on the upper surface.

8. The apparatus of claim 1 wherein the substantially flexible material comprises a plurality of substantially compressible protrusions for contacting the semiconductor wafer.

9. The apparatus of claim 1 wherein the brush comprises a central opening to facilitate fluid distribution from the brush to a semiconductor wafer surface.

10. The apparatus of claim 1, further comprising a shaft for rotating the brush holder, the shaft being connectable to the connection stud during use, the shaft comprising a conduit for introducing a cleaning fluid to a semiconductor wafer surface.

11. The apparatus of claim 10 wherein the connection stud comprises a substantially U-shaped slot, and wherein the shaft comprises an opening, and further comprising a pin adapted to extend into the slot and into the opening to connect the shaft to the connection stud during use.

12. The apparatus of claim 10 wherein the connection stud comprises a substantially U-shaped slot terminating in a substantially circular-shaped end, the slot having a width that widens at a location proximate the end, and wherein the shaft further comprises a pin sized to fit within the end such that a snap-fit engagement is formable between the shaft and the connection stud during use.

13. The apparatus of claim 1 wherein the receiving lip further comprises an inwardly-disposed lip portion, and wherein the outer edge of the backing plate is positioned between the inwardly-disposed lip portion and the lower surface of the base.

14. An apparatus for cleaning a semiconductor wafer, comprising
    a brush holder comprising a base and a connection stud extending from the base, the base comprising an upper surface, a lower surface having a receiving lip disposed thereon, and a first plurality of openings disposed between the upper surface and the lower surface, the receiving lip comprising an aperture disposed therein;
    a brush comprising a substantially flexible material for contacting the semiconductor wafer, the substantially flexible material comprising a plurality of substantially compressible protrusions; and
    a backing plate for connecting the brush to the brush holder, the backing plate comprising a second plurality of openings, an outer edge, and an alignment portion extending from the outer edge, the second plurality of openings being arranged in a pattern to match the first plurality of openings, the outer edge being capable of forming a snap-fit engagement within the receiving lip of the brush holder during use, the alignment portion being sized to fit within the aperture for aligning the first plurality of openings with the second plurality of openings during use.

* * * * *